United States Patent [19]

Crotzer et al.

[11] Patent Number: 5,527,591
[45] Date of Patent: Jun. 18, 1996

[54] ELECTRICAL CONTACT HAVING A PARTICULATE SURFACE

[75] Inventors: David R. Crotzer, Windham, N.H.; Gregory E. Dean, No. Attleboro, Mass.

[73] Assignee: Augat Inc., Mansfield, Mass.

[21] Appl. No.: 349,042

[22] Filed: Dec. 2, 1994

[51] Int. Cl.$^6$ .................................................. B32B 9/00
[52] U.S. Cl. .......................... 428/209; 439/66; 439/91; 439/931
[58] Field of Search ................................ 439/75, 81, 82, 439/87, 119, 447, 553, 445, 544, 91, 931

[56] References Cited

U.S. PATENT DOCUMENTS

| | | | |
|---|---|---|---|
| 5,083,697 | 1/1992 | Difrancesco | 228/116 |
| 5,118,299 | 6/1992 | Burns | 439/74 |
| 5,137,461 | 8/1992 | Bindra et al. | 439/74 |

OTHER PUBLICATIONS

Law, H. H., et al., Electrical Contact Phenomena of Nickel Electrodeposits with Sharp Micro–Asperities, AT&T Bell Laboratories, Murray Hill, N.J. 07974, pp. 651–659 (no date).

*Primary Examiner*—Patrick J. Ryan
*Assistant Examiner*—Kam F. Lee
*Attorney, Agent, or Firm*—Weingarten, Schurgin, Gagnebin & Hayes

[57] ABSTRACT

The present invention comprises an electrical contact having solid homogenous conductive particles on the contact surface. The particles are of greater hardness than that of the contact material to deform the contact material and cause breakage or fracture of the oxide or other contaminating layer, or to penetrate the contaminating layer. The particles are applied to the contact surface by a technique which results in the particles being intimately bonded to the contact surface, usually as a layer of particles. A preferable technique for such particle application is hypervelocity oxygen fuel spraying (HVOF) or plasma spraying, by which the particles are embedded on the contact surfaces to provide a substantially permanent interparticle bond between the applied particles and the contact material.

10 Claims, 6 Drawing Sheets

ELECTRICAL CONTACT HAVING A PARTICULATE SURFACE

FIELD OF THE INVENTION

This invention relates to electrical contacts for providing electrical interconnection between conductive surfaces.

BACKGROUND OF THE INVENTION

Electrical contact surfaces are often subject to contamination caused by oxide buildup on the contact surface or by dirt, debris or other contaminants accumulating on the contact surface. As a result, the oxide or other contaminant prevents good electrical contact between the mating surfaces with consequent increase in contact resistance and the associated generation of increased heat. The resultant poor electrical connection is especially a problem in small area electrical contacts such as are employed in integrated circuit packages and other electronic packages where a large number of electrical leads or contact areas are provided in a relatively small area.

SUMMARY OF THE INVENTION

The present invention comprises an electrical contact having solid homogenous conductive particles on the contact surface. The particles are of greater hardness than that of the contact material to deform the contact material and cause breakage or fracture of the oxide or other contaminating layer, or to penetrate the contaminating layer. The particles are applied to the contact surface by a technique which results in the particles being intimately bonded to the contact surface, usually as a layer of particles. A preferable technique for such particle application is hypervelocity oxygen fuel spraying (HVOF) or plasma spraying, by which the particles are embedded on the contact surfaces to provide a substantially permanent interparticle bond between the applied particles and the contact material.

The contact surface on which the particle layer is provided can be the outer surface of a single layer or multi-layer electrical contact structure. The contact surface can alternatively be the outer surface of a plated or other contact layer which is itself provided on a supporting structure. The contact surface can be, for example, on a contact pad or contact area of an integrated circuit or other electronic device or package, circuit board or other type of electrical device such as a switch, keypad and the like. The contact surface may also be on a resilient substrate or element such as shown in co-pending application, Ser. No. 08/294,370, filed Aug. 23, 1994 (AUG-C-549XX). The particles can also be provided on the conductive surface of an electrical shield, ground plane or gasket.

The solid homogenous conductive particles can be composed of noble metals such as gold, silver, platinum and palladium, other metals such as copper, nickel and iron, or conductive compounds such as tungsten carbide or chromium carbide. A metal filler, such as cobalt, copper or silver can be added to the carbide to increase the conductivity. The particle sizes can range from about 200 microinches to about 1 microinch or less. The particle size should be greater than the thickness of the oxide or other contaminating coating in order to engage the underlying contact surface. The oxide thickness can vary considerably, and can typically be in the range of about 100 Angstroms to about 1 mil. The hardness of the particles typically is in the range of about 100–7000 on the Knoop scale. Particles of different sizes can be employed together and applied randomly to the contact surface. The particles may be in a continuous layer or in a non-continuous layer on a contact surface.

The mating contact surface which engages the particulate surface can itself be a similar particulate surface or a nonparticle covered contact surface.

The conductive particles can be applied to a conductive as well as a non-conductive substrate. For use with a non-conductive substrate, the particles can serve as the only conductive layer, or the conductive particles can be provided on an intermediate conductive plating or other layer which itself is on the nonconductive substrate.

DETAILED DESCRIPTION

Figure 1:
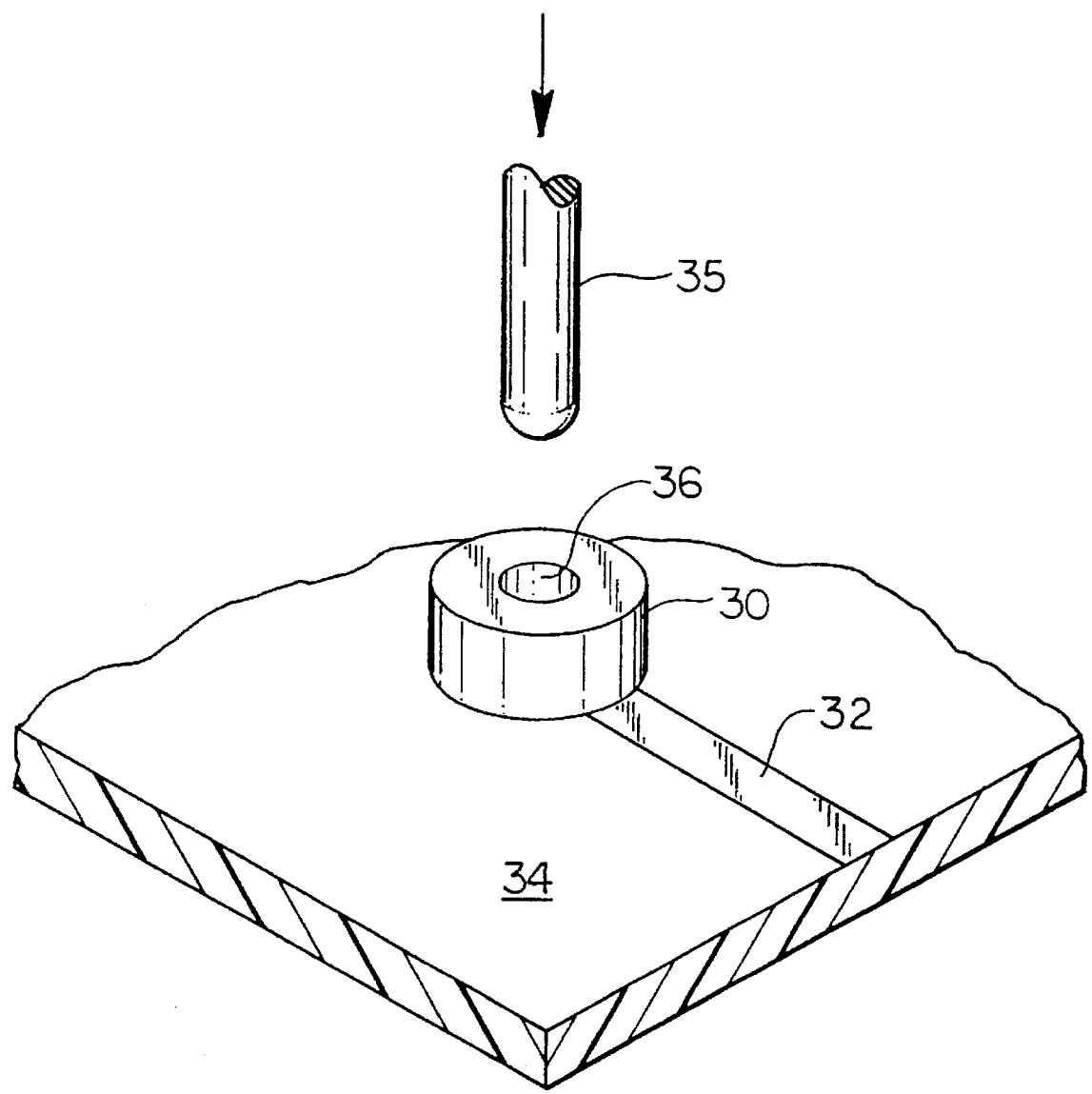
FIG. 1 illustrates an annular ring embodying the invention for contacting an inserted terminal pin.

Referring to FIG. 1, there is shown an annular ring 30 which is connected to one or more circuit traces 32 of a printed circuit board 34. The ring is aligned around a hole through the circuit board and into which a lead 35 of an electrical or electronic device is inserted. The ring is composed of a resilient core of material such as silicon rubber having a flexible conductive coating or layer on the surfaces of the ring. The opening through the annular ring is slightly smaller than the diameter of the electrical lead or pin to be inserted therethrough such that compressive force is provided between the inserted lead and surrounding ring to maintain the lead in position.

The flexible conductive layer is provided preferably by a chemical grafting technique by which metallization is provided on the surfaces of the ring. The conductive coating can also be applied by techniques such as dipping, ink jet printing, roller coating, screen printing, or spray coating, which techniques are themselves known in the art. A particulate layer is provided over the conductive layer of the ring or at least over the contact portions of the conductive layer, in this case the circumferential wall 36 of the ring. The particulate layer is composed of conductive and homogeneous hard particles which are of greater hardness than the hardness of the mating contact surface or surfaces. In one embodiment, the particles are carborundum having a metal such as copper or silver disposed therein. A hardness typically in the range of about 100–7000 on the Knoop scale is suitable. Preferably, the particles are plasma injected onto the conductive coating.

The conductive coating is sufficiently flexible and resilient to not impede the resilience of the core material. The ring can compress when in contact with a mating electrical lead and expand when out of mating contact without peeling or cracking of the conductive coating on the surface of the ring.

The resilient interconnect ring can be fabricated by molding the core material in the desired shape. A metallization is applied to the ring surfaces preferably by chemical grafting, and the particulate layer is then applied to the surface of the metallization layer. Copper or other metal may optionally be electroless plated onto the metallization layer prior to application of the particulate layer.

Figure 2:
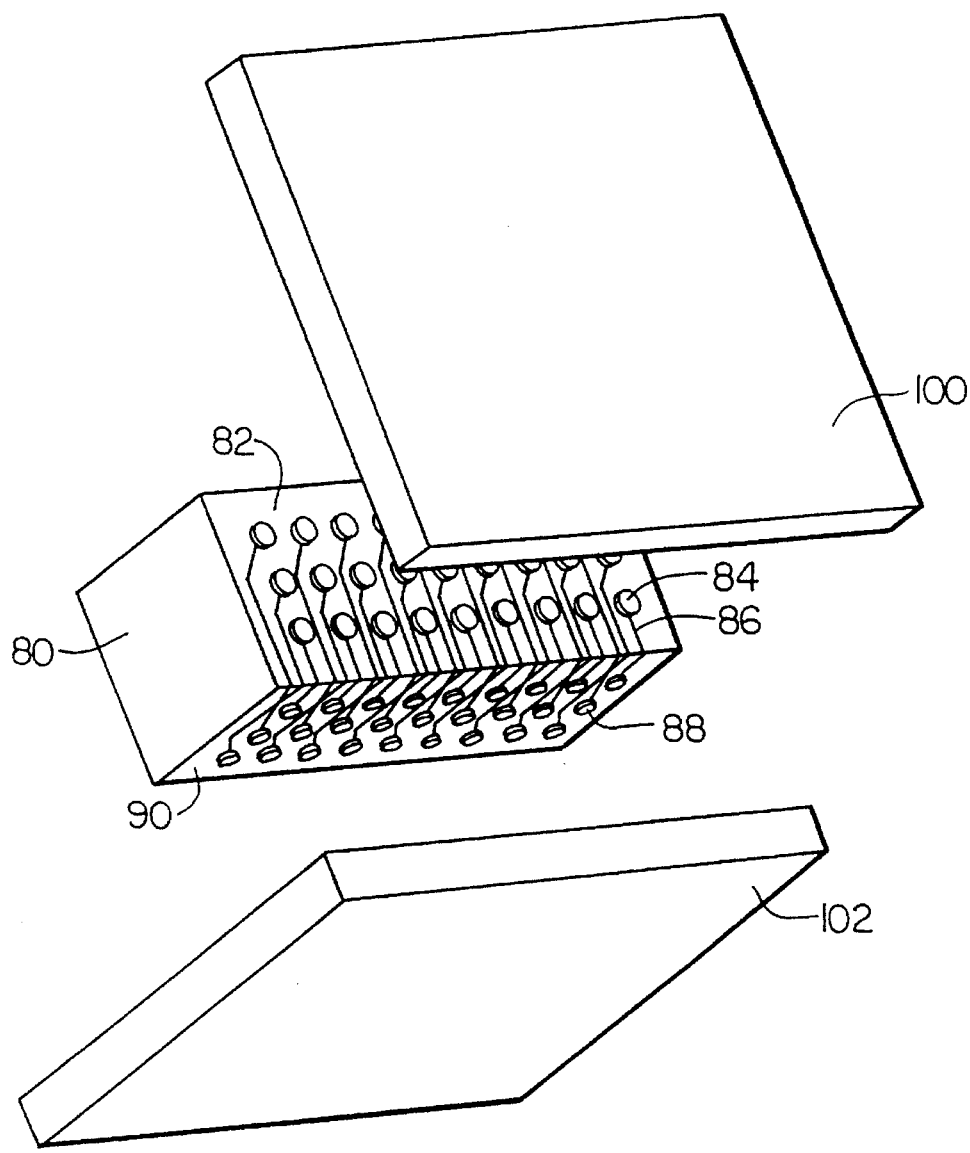
FIG. 2 illustrates a board-to-board connector with contacts embodying the invention.

A further embodiment is illustrated in FIG. 2 which shows a right angle board to board connector which includes a connector body 80 formed of a suitable dielectric material such as FR-4, Teflon (PTFE) or phenolic, having on a first face 82 a plurality of conductive contact areas 84 arranged in an intended pattern, and electrically connected via conductive traces 86 to corresponding contact areas 88 provided on an orthogonal face 90 of the body. In use, the contact areas 84 are mated to corresponding contact areas of printed circuit board 100, and contact areas 88 are mated to corresponding contact areas of printed circuit board 102. The interconnection assembly of the two circuit boards and connector body is maintained by a suitable mechanism (not shown) and which per se is known in the connector field.

Figure 2A:
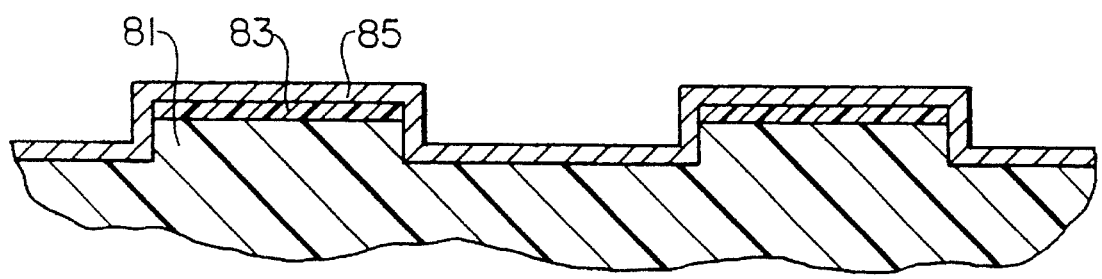
FIG. 2a is a partial elevation view of an alternative contact structure for the connector of FIG. 2.

The contact areas 84 and 88 have a particulate layer provided on the contact surfaces thereof. The surfaces of the body on which the contact areas 84 and 88 are formed may have raised pedestal areas, and which may have a resilient layer on which the conductive contact layer is provided. Referring to FIG. 2a, there is shown a portion of one of the surfaces of the connector body 80 having raised pedestals 81. A resilient layer 83 is provided on the outer surfaces of the pedestals, and over which a conductive layer 85 is provided having the particles embedded thereon in accordance with the invention. Alternatively, the connector body 80 may itself be of a resilient or elastomeric material which is compressed during engagement of the contact areas with the associated circuit boards to provided contact pressure.

Figure 3:
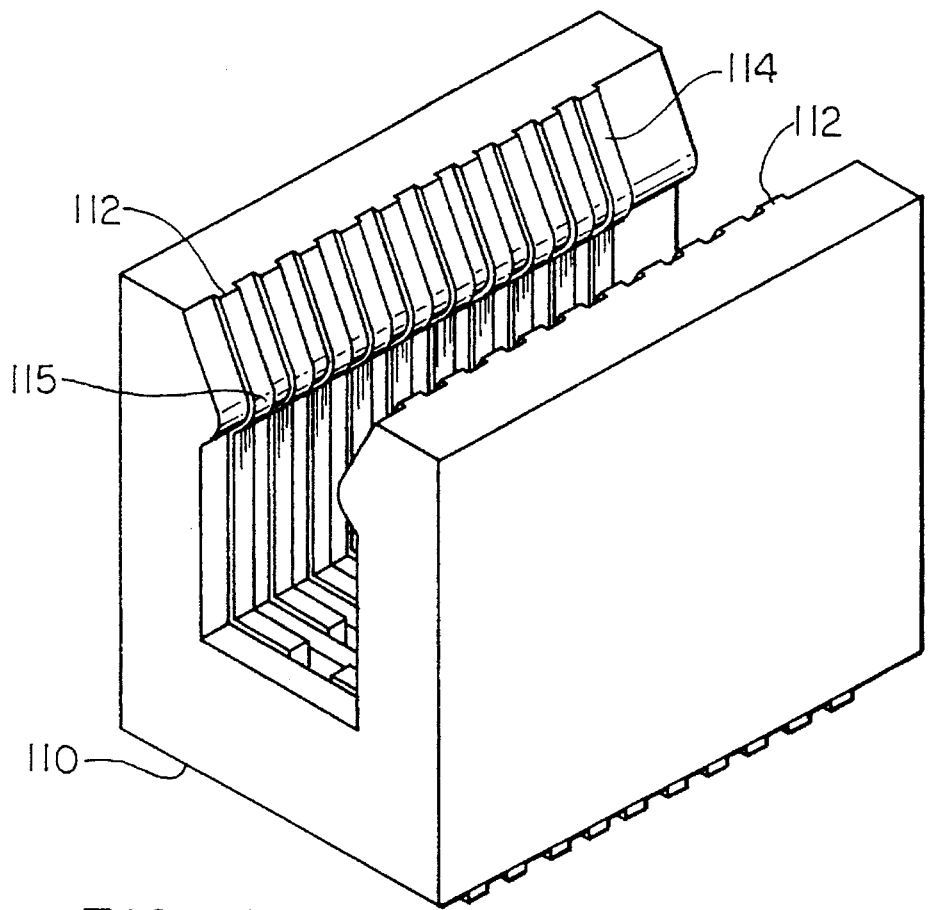
FIG. 3 shows an edge card connector having contact areas according to the invention.
Figure 4A:
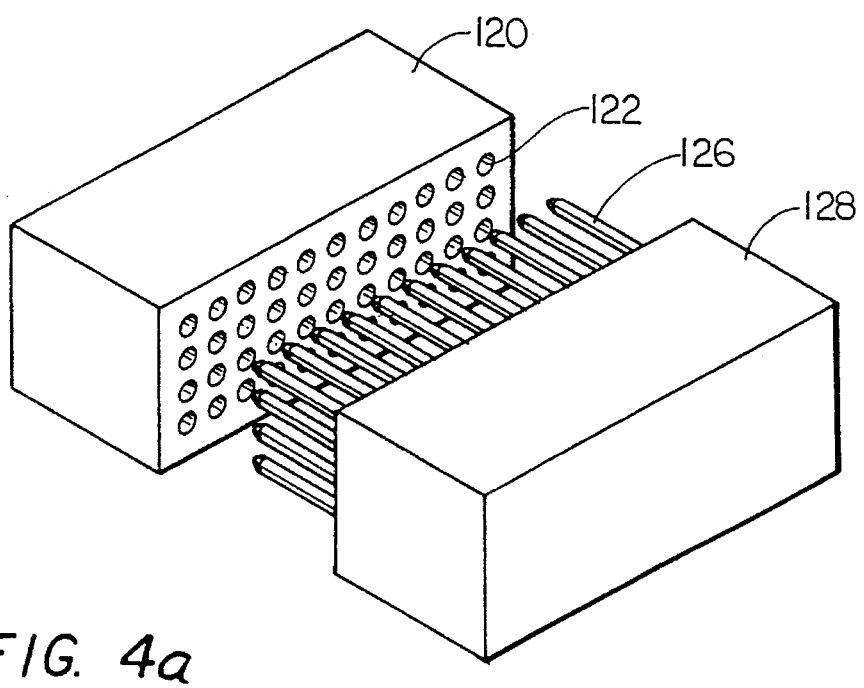
FIGS. 4a through 4d show respective views of a terminal pin interconnect embodying the invention.
Figure 4B:
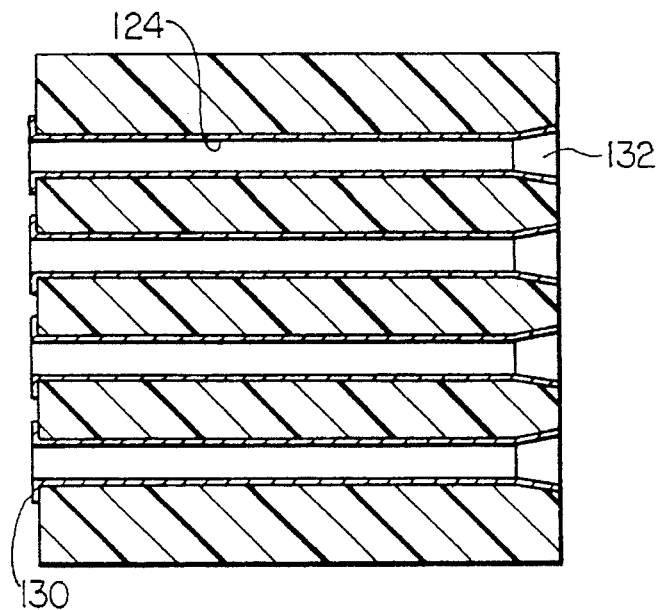
Figure 4C:
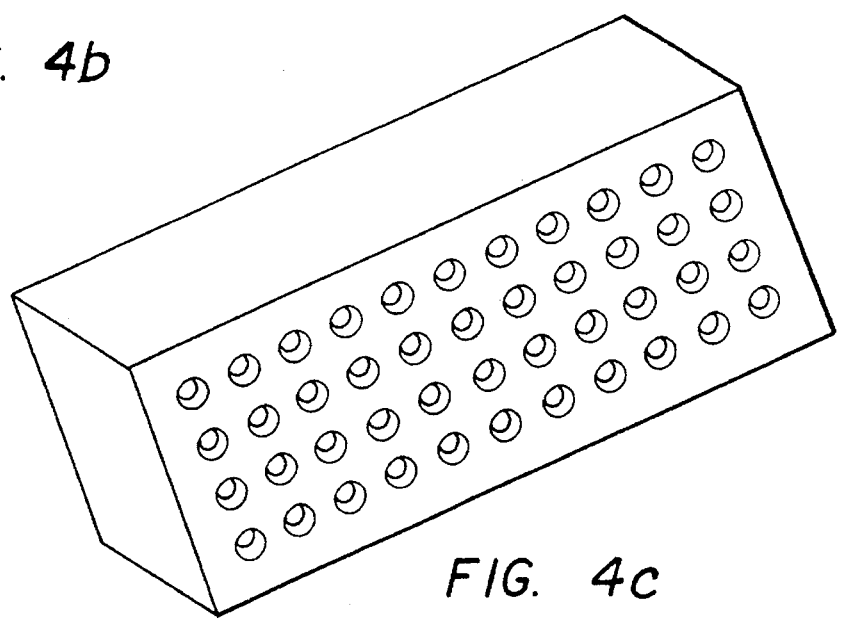
Figure 4D:
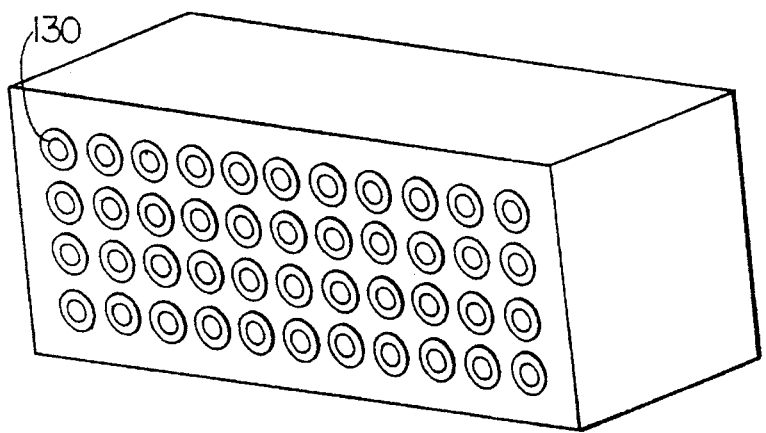

Referring to FIG. 3, an edge card connector is shown which comprises a body 110 of elastomeric material having a plurality of raised ridges 112 onto each of which a conductor 114 is provided. The conductors extend down respective sides of the body, as illustrated and through openings in the bottom portion of the body and thence along the bottom surface of the body. The particulate layer is provided on at least the contact portions 115 of the conductors 114. A circuit board or circuit card having contact areas corresponding to the contact areas of the connector is inserted, into the connector body for engagement with the respective contact portions 115 of the connector. The illustrated edge card connector has contacts on opposite sides to engage opposite rows of contact areas of a double sided circuit board or card. It will be recognized that single sided connectors can also be provided to engage and make contact with single sided circuit cards. Various other connector configurations are also contemplated to accommodate various electrical and electronic interconnect applications and configurations.

Another embodiment is illustrated in FIGS. 4a through 4d wherein the conductive particulate coatings are provided within openings of a female socket or interconnect. The interconnect body 120 has a plurality of holes 122 therethrough each of which has a conductive surface with particulate coating 124 for electrical contact of corresponding electrical pins 126 of a mating connector 128. Each of the conductive surfaces of the interconnect openings terminate on the back surface in an annular contact area 130 for mating with appropriate circuit board or other interconnections. Each of the connector openings can have an outwardly flared entry section 132 which also has a conductive coating. The particulate coating can also be provided on the contact surfaces of areas 130.

Figure 5:
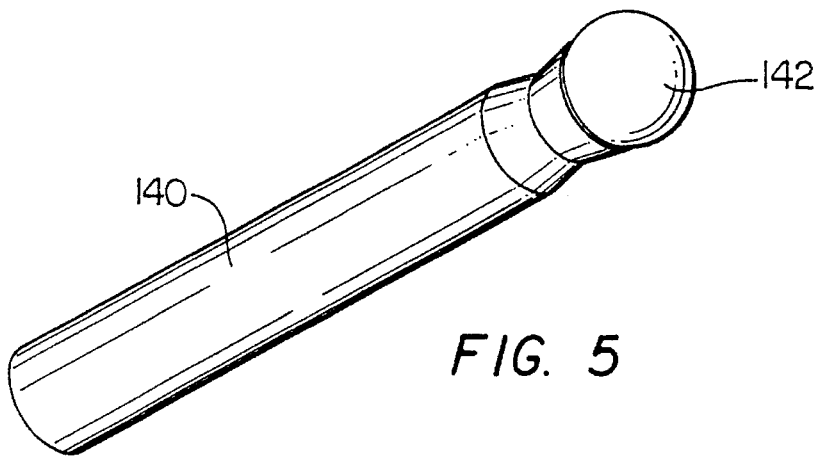
FIG. 5 illustrates a test probe having a resilient contact tip embodying the invention.

Referring to FIG. 5, there is shown an electrical test probe having a probe body 140 with an elastomeric spherical probe tip 142 secured at one end. The tip is an elastomeric ball having a conductive surface with particulate coating. The probe body has a conductive surface or may be of conductive material such as metal. The probe body is retained within a suitable fixture to position the tip over the contact area and to compress the tip against the contact area for electrical engagement therewith.

Figure 6A:
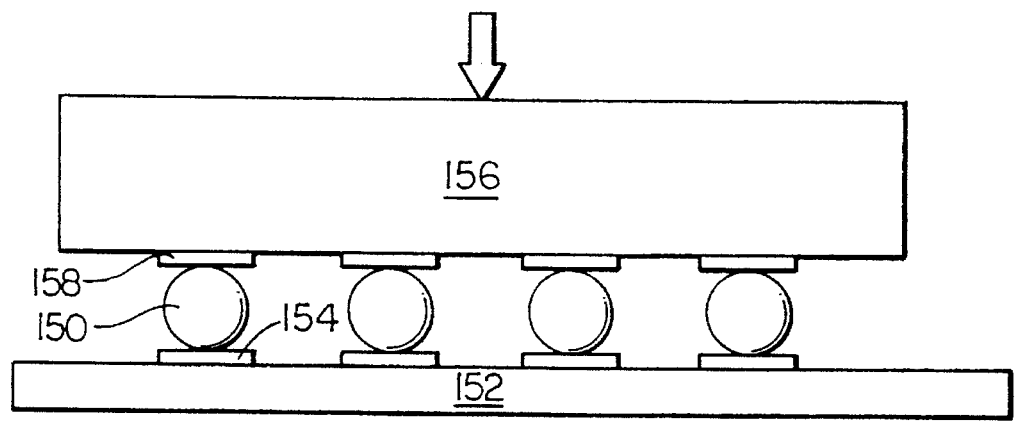
FIGS. 6a and 6b illustrate a resilient interconnect embodying the invention.
Figure 6B:
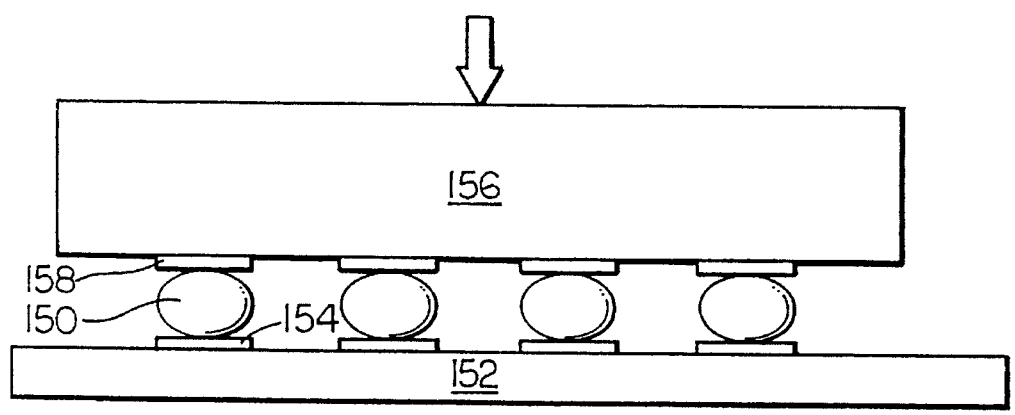

The elastomeric spheres with conductive particulate surfaces can also be embodied in an interconnection device as shown in FIGS. 6a and 6b. The spheres 150 are retained within a suitable housing (not shown) which is interposed between a printed circuit board 152 having conductive pads 154, and an electronic device 156 also having conductive pads 158. The device is forced toward the printed circuit board against the biasing of the elastomeric spheres and the pad areas of the device and circuit board are interconnected by the interposed conductive spheres. The device is maintained in contact engagement with the circuit board by a suitable socket mechanism (not shown).

Figure 7A:
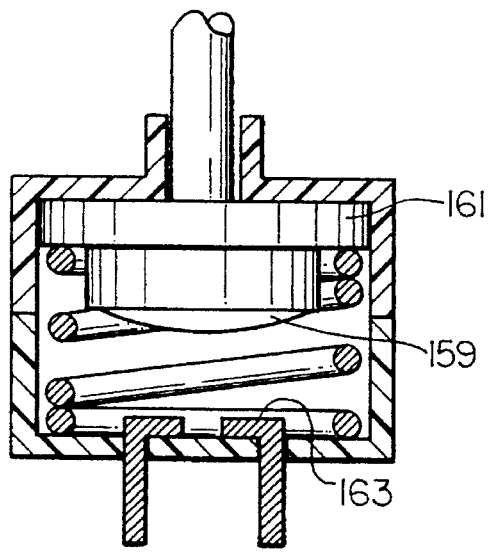
FIGS. 7a through 7c illustrate electrical switch devices having contact areas according to the invention.
Figure 7B:
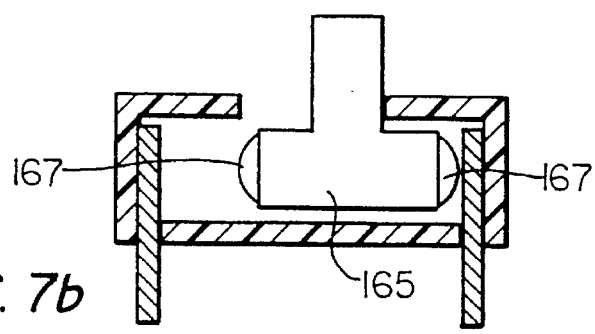
Figure 7C:
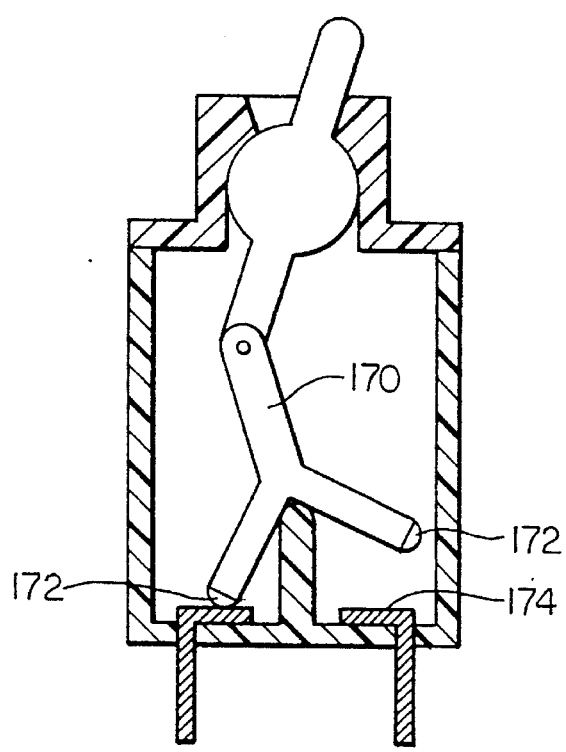

The invention can also be usefully employed in the fabrication of electrical switches, such as shown in FIGS. 7a through 7c, In each of these switches, one or more conductive particulate contact areas 159 is applied to the switch actuator 161. A pushbutton switch is shown in FIG. 7a in which a conductive particulate contact area 159 is provided on the actuator. Upon manual depression of the actuator, the contact area engages the confronting contact areas 163 of the switch terminals. It will be appreciated that various switch configurations can be provided to provide intended switch operation. A slide switch is shown in FIG. 7b in which the slidable actuator 165 includes particulate contact areas 167 on respective ends. A toggle switch is depicted in FIG. 7c in which the toggle mechanism 170 includes particulate contact areas 172. The contact areas 174 of the switch terminals can also have the particulate layer mateable with the particulate layer of the actuator.

The invention is not to be limited by what has been particularly shown and described, as variations and alternative implementations will occur to those of skill in the art without departing from the true scope of the invention.

We claim:

1. An electrical contact comprising:

a substrate having a contact surface;

a plurality of solid homogenous conductive particles permanently applied to the contact surface so as to provide a conductive contact area; wherein the conductive particles have a hardness in the range of 100–7000 on the Knoop scale, and a size range from about 200 microinches to about 1 microinch or less, the particle size being greater than the thickness of an oxide or other contaminating coating on a mating contact surface.

2. The electrical contact of claim 1 wherein the conductive particles are bonded to the contact surface by hypervelocity oxygen fuel spraying.

3. The electrical contact of claim 1 wherein the conductive particles are bonded to the contact surface by plasma spraying.

4. The electrical contact of claim 1 wherein the conductive particles have a hardness greater than that of the contact material as measured on the Knoop scale.

5. The electrical contact of claim 1 wherein the conductive particles are composed of carborundum with a conductive material dispersed therein.

6. The electrical contact of claim 1 wherein the conductive particles are composed of a noble metal.

7. The electrical contact of claim 1 wherein the conductive particles are composed of a conductive compound.

8. An electrical circuit board comprising:

an insulating substrate having a surface;

a plurality of electrical contact areas on the surface;

a plurality of solid homogeneous conductive particles permanently applied to each electrical contact area, the particles having a hardness greater than the hardness of the contact material of the electrical contact areas; wherein the conductive particles have a hardness in the range of 100–7000 on the Knoop scale, and a size range from about 200 microinches to about 1 microinch or less, the particle size being greater than the thickness of an oxide or other contaminating coating on mating contact areas.

9. The circuit board of claim 8 wherein the substrate is rigid and further including a resilient layer between the substrate surface and the electrical contact areas.

10. An electrical device comprising:

a substrate of electrically insulating material;

an electrical contact material on at least a portion of the substrate;

a plurality of solid homogeneous conductive particles permanently applied to the electrical contact material so as to provide a conductive particulate contact area; wherein the conductive particles have a hardness in the range of 100–7000 on the Knoop scale, and a size range from about 200 microinches to about 1 microinch or less, the particle size being greater than the thickness of an oxide or other contaminating coating on the contact area of a mating contact material.

* * * * *